(12) United States Patent
Fragala et al.

(10) Patent No.: US 8,393,011 B2
(45) Date of Patent: Mar. 5, 2013

(54) PIEZORESISTOR HEIGHT SENSING CANTILEVER

(75) Inventors: Joseph S. Fragala, San Jose, CA (US); Albert K. Henning, Palo Alto, CA (US); Raymond R. Shile, Los Gatos, CA (US)

(73) Assignee: NanoInk, Inc., Skokie, IL (US)

( * ) Notice: Subject to any disclaimer, the term of this patent is extended or adjusted under 35 U.S.C. 154(b) by 36 days.

(21) Appl. No.: 12/465,625

(22) Filed: May 13, 2009

(65) Prior Publication Data

US 2010/0100989 A1    Apr. 22, 2010

Related U.S. Application Data

(60) Provisional application No. 61/052,864, filed on May 13, 2008, provisional application No. 61/167,853, filed on Apr. 8, 2009.

(51) Int. Cl.
    *G01Q 70/14* (2010.01)
(52) U.S. Cl. .................. 850/52; 850/56; 850/59
(58) Field of Classification Search ................. 850/1, 2, 850/3, 4, 40, 52, 56, 59, 60, 61, 62, 63; 73/104, 73/105, 106; 250/306, 307, 309, 310, 311
    See application file for complete search history.

(56) References Cited

U.S. PATENT DOCUMENTS

| | | | |
|---|---|---|---|
| 5,386,720 A * | 2/1995 | Toda et al. | 73/105 |
| 5,443,791 A | 8/1995 | Cathcart et al. | |
| 5,595,942 A | 1/1997 | Albrecht et al. | |
| 5,705,814 A | 1/1998 | Young et al. | |
| 5,981,733 A | 11/1999 | Gamble et al. | |
| 6,148,662 A | 11/2000 | Lin | |
| 6,249,747 B1 * | 6/2001 | Binnig et al. | 702/33 |
| 6,415,653 B1 * | 7/2002 | Matsuyama | 73/105 |
| 6,573,369 B2 | 6/2003 | Henderson et al. | |
| 6,635,311 B1 | 10/2003 | Mirkin et al. | |
| 6,642,129 B2 | 11/2003 | Liu et al. | |
| 6,787,313 B2 | 9/2004 | Morozov et al. | |
| 6,827,979 B2 | 12/2004 | Mirkin et al. | |
| 6,867,443 B2 | 3/2005 | Liu et al. | |
| 6,998,228 B2 | 2/2006 | Henderson et al. | |
| 7,005,378 B2 | 2/2006 | Crocker et al. | |
| 7,008,769 B2 | 3/2006 | Henderson et al. | |
| 7,034,854 B2 | 4/2006 | Cruchon-Dupeyrat et al. | |
| 7,060,977 B1 | 6/2006 | Dupeyrat et al. | |
| 7,098,056 B2 | 8/2006 | Demers et al. | |
| 7,199,305 B2 | 4/2007 | Cruchon-Dupeyrat et al. | |
| 7,273,636 B2 | 9/2007 | Mirkin et al. | |

(Continued)

FOREIGN PATENT DOCUMENTS

| | | |
|---|---|---|
| JP | 06-300557 A | 10/1994 |
| JP | 06-307852 A | 11/1994 |

(Continued)

OTHER PUBLICATIONS

Gotszalk et al. "Fabrication of Multipurpose AFM/SCM/SEP Microprobe with Integrated Piezoresistive Deflection Sensor and Isolated Conductive Tip", Microelectronic Engineering 41/42 (1998) 447-480.*

(Continued)

*Primary Examiner* — David A Vanore
*Assistant Examiner* — Nicole Ippolito
(74) *Attorney, Agent, or Firm* — Foley & Lardner LLP

(57) ABSTRACT

A device comprising at least one cantilever comprising at least one piezoresistor is described, where the cantilevers comprise silicon nitride or silicon carbide and the piezoresistors comprise doped silicon. Methods for making and using such a device are also provided.

31 Claims, 7 Drawing Sheets

Wafer Bond.  TMAH.  Oxide etch.

U.S. PATENT DOCUMENTS

| | | | |
|---|---|---|---|
| 7,279,046 | B2 | 10/2007 | Eby et al. |
| 7,326,380 | B2 | 2/2008 | Mirkin et al. |
| 7,361,310 | B1 | 4/2008 | Mirkin et al. |
| 7,491,422 | B2 | 2/2009 | Zhang et al. |
| 2002/0117611 | A1* | 8/2002 | Kley .................... 250/234 |
| 2002/0122873 | A1 | 9/2002 | Mirkin et al. |
| 2003/0005755 | A1 | 1/2003 | Schwartz |
| 2003/0007242 | A1 | 1/2003 | Schwartz |
| 2003/0022470 | A1 | 1/2003 | Liu et al. |
| 2003/0068446 | A1 | 4/2003 | Mirkin et al. |
| 2004/0175631 | A1 | 9/2004 | Crocker et al. |
| 2005/0009206 | A1 | 1/2005 | Mirkin et al. |
| 2005/0117163 | A1* | 6/2005 | Ng et al. ................ 356/501 |
| 2005/0199047 | A1* | 9/2005 | Adams et al. ............. 73/105 |
| 2005/0235869 | A1 | 10/2005 | Cruchon-Dupeyrat et al. |
| 2005/0255237 | A1* | 11/2005 | Zhang et al. .............. 427/180 |
| 2006/0014001 | A1 | 1/2006 | Zhang et al. |
| 2006/0040057 | A1 | 2/2006 | Sheehan et al. |
| 2006/0228873 | A1 | 10/2006 | Liu et al. |
| 2008/0022778 | A1* | 1/2008 | Liu et al. .................. 73/726 |
| 2008/0105042 | A1 | 5/2008 | Mirkin et al. |
| 2008/0315092 | A1* | 12/2008 | Kley ....................... 250/307 |
| 2009/0110951 | A1* | 4/2009 | Kuo et al. ................. 428/600 |
| 2009/0307808 | A1* | 12/2009 | Bos et al. .................. 850/39 |
| 2010/0071098 | A1 | 3/2010 | Mirkin et al. |
| 2010/0115672 | A1 | 5/2010 | Mirkin et al. |
| 2010/0229265 | A1* | 9/2010 | Jin et al. .................. 850/60 |

FOREIGN PATENT DOCUMENTS

| | | |
|---|---|---|
| WO | WO 2004/105046 A2 | 12/2004 |
| WO | WO 2007/126689 A1 | 11/2007 |

OTHER PUBLICATIONS

Bashir et al. "On the Design of Piezoresistive Silicon Cantilevers with Stress Concentration Regions for Scanning Probe Microscopy Applications", Journal of Micromechanical Microengineering 10 (2000) 483-491.*

U.S. Appl. No. 11/268,740, filed Nov. 5, 2005, Shile et al.

International Search Report and Written Opinion in corresponding PCT Application No. PCT/US2009/043865 dated Nov. 19, 2009.

Akamine, S. et al., "Low temperature thermal oxidation sharpening of microcast tips," 10 *J. Vac. Sci. Technol. B, Microelectronics Nanometer Struc.* 2307 (1992).

Albrecht, T. et al., "Microfabrication of cantilever styli for the atomic force microscope," 8 *J. Vac. Sci. Technol. A, Vac. Surf. Films* 3386 (1990).

Bashir, R. et al., "On the design of piezoresistive silicon cantilevers with stress concentration regions for scanning probe microscopy applications; Piezoresistive silicon cantilevers with stress concentration regions for SPM applications," 10 J. Micromech. Microeng. 483 (2000).

Bottomley, 70 *Anal. Chem.*, 425R-475R (1998).

Engel, J. et al., "Strain sensitivity enhancement of thin metal film strain gauges on polymer microscale structures," 89 *App. Phys. Lett.* 221907 (2006).

Gaitas, A., "Novel single cell disease markers with a hybrid AFM scanning piezothermal probe," NIH grant 1R43GM084520-01, (May 15, 2008).

Ginger, et al., "The Evolution of Dip-Pen Nanolithography," 43 *Angew. Chem. Int. Ed.* 30 (2004).

Goericke, F. et al., "Microcantilever hotplates with temperature-compensated piezoresistive strain sensors," 143 *Sensors and Actuators* 181 (2008).

Gotszalk, T. et al., "Fabrication of Multipurpose AFM/SCM/SEP Microprobe with Integrated Piezoresistive Deflection Sensor and Isolated Conductive Tip" 41-42 Microelec. Eng. 477 (1998).

Jumpertz, R. et. al., "Piezoresistive bridge configuration for atomic force microscopy," in *Proceedings: European Solid-State Device Research Conference (ESSDRC)*, 680-682 (1997).

Kanda, Y. ED-29 *IEEE Trans. Elec. Dev.* 64 (1982).

Kim, Y. et al., "A self-actuating PZT cantilever integrated with piezoresistor sensor for AFM with high speed parallel operation," *Proceedings of the IEEE 15th Annual Int'l Conference on Microelectro Mechanical Systems* 689-692 (2002).

Madou, *Fundamentals of Microfabrication*, (2nd ed. 2002).

Perez, R. et al. "Fabrication, modeling and integration of a silicon technology force sensor in a piezoelectric micro-manipulator," 128 *Sens. Actuators* 367 (2006).

Pique, et al., *Direct-Write Technologies for Rapid Prototyping Applications: Sensors, Electronics, and Integrated Power Sources*, (2002).

Salaita, et al., "Applications of Dip-Pen Nanolithography," *Nature Nanotechnology* 2 (2007).

Tortonese, M. et al., 62 *Appl. Phys. Lett.* 834 (1993).

Van Zant, *Microchip Fabrication*, (5th ed. 2004).

* cited by examiner

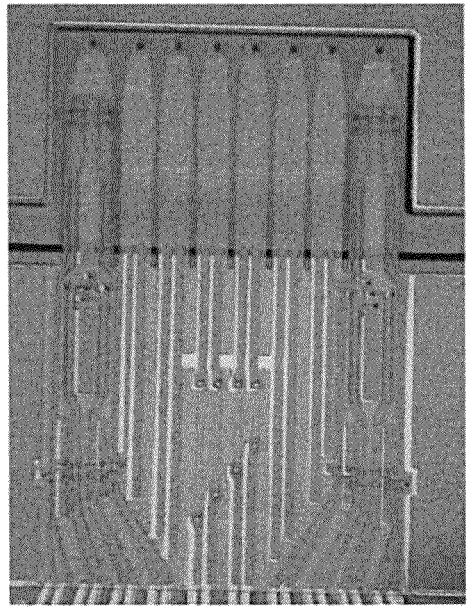
Fig. 2A
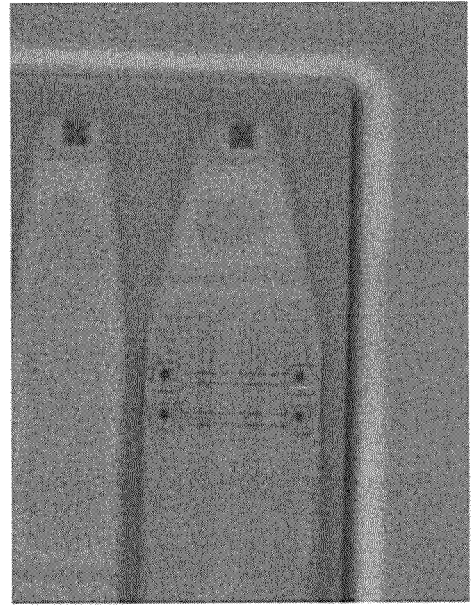
Fig. 2B
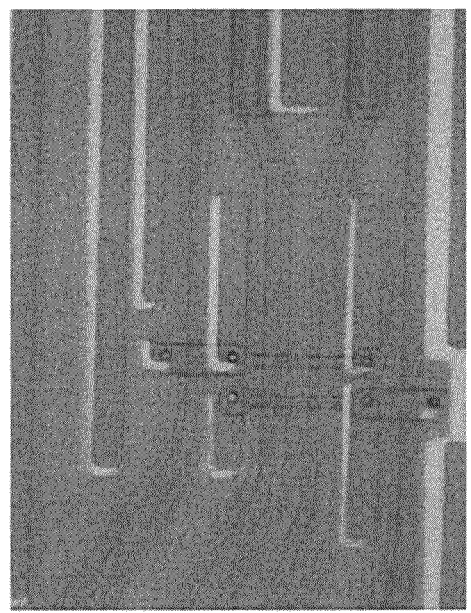
Fig. 2C
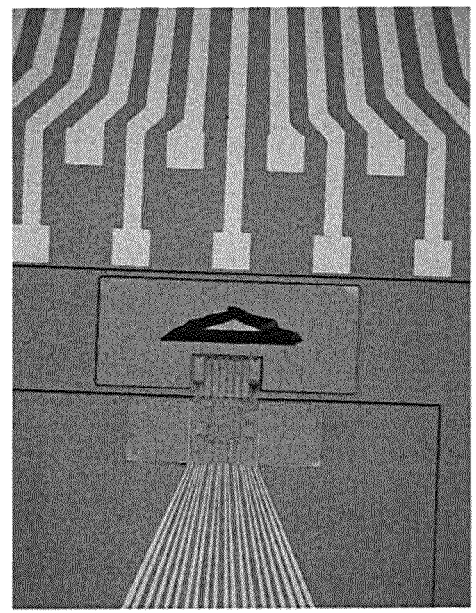
Fig. 2D
Figure 2

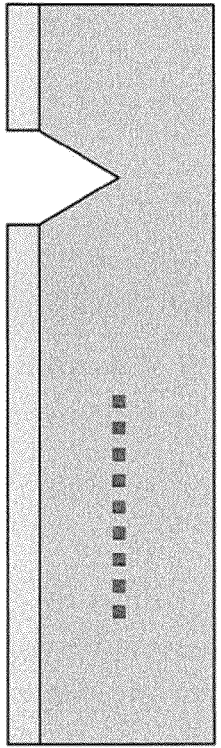
Fig. 3A. Tip Definition: Grow 100 nm oxide; pattern.
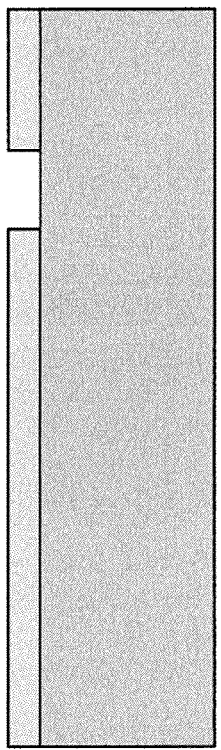
Fig. 3C. Tip Etch: NOTE—Might be a problem with KOH etch resistance of implanted oxide.
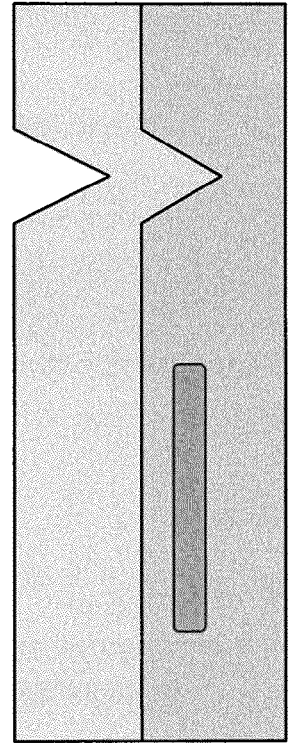
Fig. 3B. Piezoresistor Implant: 5E16 $cm^{-2}$, 150 keV, B11.
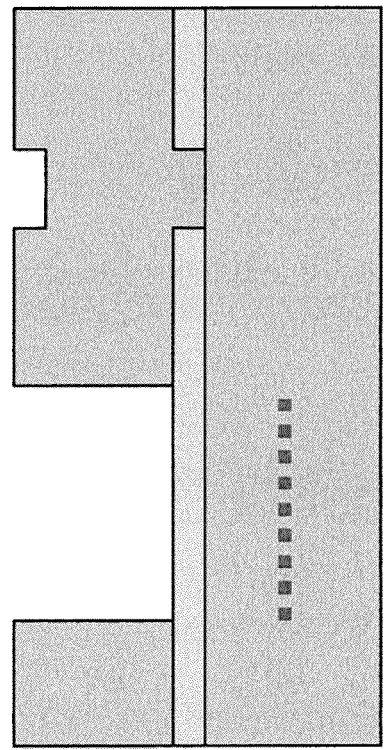
Fig. 3D. Strip Ox. Tip Sharpen Ox.

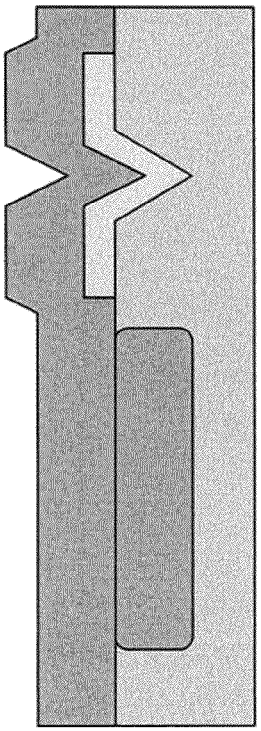
Fig. 3E. Etch Tip Sharpen Ox. Remove resist.
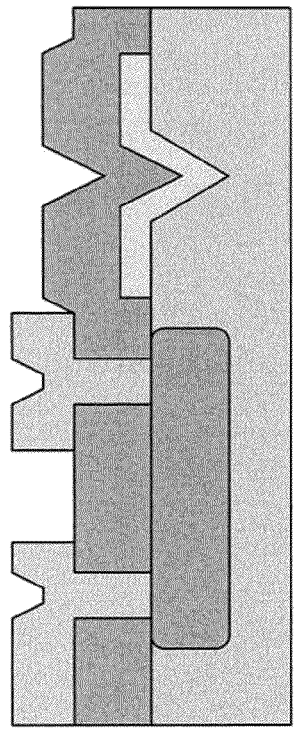
Fig. 3G. Piezoresistor Anneal. 1000 °C Argon, 3 hrs.
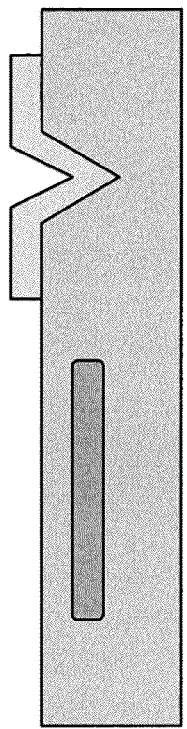
Fig. 3F. Deposit Nitride.
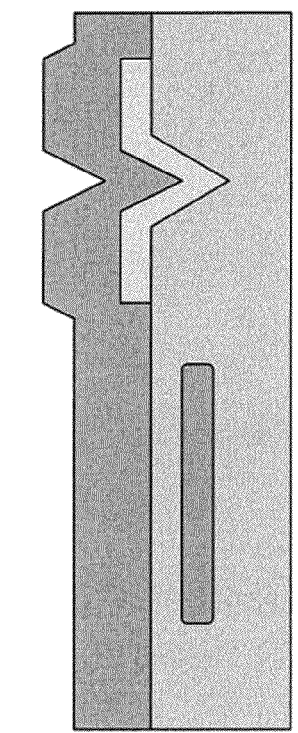
Fig. 3H. Cantilever and Contact Etch. Gold Dep and Lift-Off.

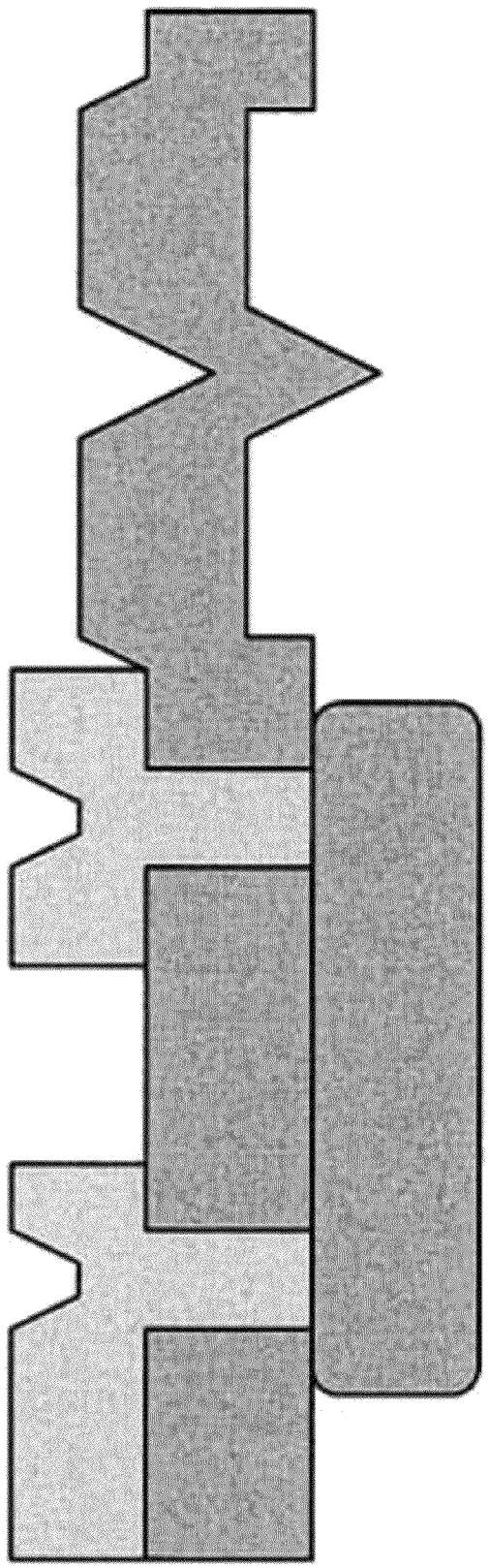
Fig. 3I. Wafer Bond. TMAH. Oxide etch.

PIEZORESISTOR HEIGHT SENSING CANTILEVER

RELATED APPLICATIONS

This application claims the benefit of U.S. Provisional Applications No. 61/052,864, filed May 13, 2008, and U.S. Provisional Application No. 61/167,853, filed Apr. 8, 2009, each of which are incorporated by reference in their entirety.

FEDERAL FUNDING

The claimed inventions described herein were developed with use of NIH SBIR funds grant no. 2 R33 HG002978-02. The government has certain rights in the invention.

BACKGROUND

Silicon has been used frequently for the manufacture of cantilevers adapted for instrumentations such as scanning probe and atomic force microscope. A cantilever can not only act as an arm providing a tip at its proximate end for applications, such as lithography and surface topography scanning, but can also provide a sensing mechanism to detect the distance between the substrate surface and the cantilever itself. See, for example, M. Tortonese et al., *Appl. Phys. Lett.* 62 (1993), pp. 834-836; U.S. Pat. No. 5,595,942 to T. Albrecht et al. More recently, piezoresistors have been incorporated into such silicon-based device. See, for example, R. Jumpertz, et al., *In Proceedings, European Solid-State Device Research Conference (ESSDRC)*, pp. 680-683 (1997); F. Goericke et al., *Sensors and Actuators* A143 (2008), pp. 181-190; A. Gaitas, "Novel single cell disease markers with a hybrid AFM scanning piezo-thermal probe." NIH grant 1R43GM084520-01, 15 May 2008.

One significant drawback of using silicon as a base material for the cantilever is the electrical charging of the probe and cantilever, and a lack of control of the electrostatic fields in the device, because silicon is an electrical conductor. Particularly, when the applications involve biological materials, either to sense these materials or to deposit these materials onto a substrate using lithography, the presence of an uncontrolled electrical field and other electrical charging mechanisms can adversely impact the applications.

Additionally, the commonly available piezoresistor utilizes lightly-doped silicon or intrinsic silicon often to maximize the piezo response. However, it is also generally known in the art that while the lightly-doped silicon design can provide a large piezo response, it can suffer a drawback of needing for temperature compensation, which is often difficult. See, for example, Y. Kanda, "*IEEE Trans. Elec. Dev.* ED-29, pp. 64-70 (1982).

Thus, there exists a need to provide a better height-sensing mechanism for the design of the cantilever.

SUMMARY

Provided herein are devices, apparatuses, compositions, methods of making same, and methods of using same.

One embodiment provides a device comprising at least one cantilever comprising at least one piezoresistor, where the at least one cantilevers comprise silicon nitride or silicon carbide, the at least one piezoresistor is disposed on the at least one cantilever, and the at least one piezoresistor comprises silicon and at least one dopant.

Another embodiment provides a method comprising forming at least one piezoresistor in a handle wafer, forming at least one cantilever disposed on the handle wafer, annealing the handle wafer for a time sufficient to allow the at least one piezoresistor to contact the at least one cantilever, and separating the combined at least one piezoresistor and the at least one cantilever from at least a portion of the remaining handle wafer.

Yet another embodiment provides a method comprising measuring at least one resistance of at least one piezoresistor, determining a maximum or minimum resistance from those measurements, determining a specific location corresponding to the location of the maximum or minimum resistance, and calculating a tip deflection.

Still another embodiment provides a method comprising measuring at least one resistance of at least one strain gauge. determining a maximum or minimum resistance from those measurements, determining a specific location corresponding to the location of the maximum or minimum resistance, and calculating a tip deflection.

At least one advantage of at least one embodiment includes improved control over electrostatic fields.

At least one advantage of at least one embodiment includes decreased electrical noise in measured signals.

At least one advantage of at least one embodiment includes improved compatibility with biological materials.

At least one advantage of at least one embodiment includes enhanced resilience to changes in temperature.

BRIEF DESCRIPTION OF THE DRAWINGS

FIGS. 2A-2J show optical images of various cantilevers with piezoresistor designs: 2A: cantilevers with 'twist' sensors; 2B close-up of "twist" sensors on cantilever end; 2C: close-up of reference 'twist' sensors; 2D: view of general pad and die design; 2E: Long longitudinal sensors, contacts off-cantilever; 2F: short longitudinal sensors, contacts on-cantilever; 2G: longitudinal sensors, contacts off-cantilever; 2H: integrated longitudinal sensors, contacts off-cantilever, with thermal active pen heater wires; 2I: 'twist' sensors, prior to handle bonding; 2J: close-up, long longitudinal sensors, on-cantilever contact, prior to handle bonding.

FIGS. 3A-3I provides schematics of a process flowchart of a fabrication procedure in one embodiment.

DETAILED DESCRIPTION

Figure 1:
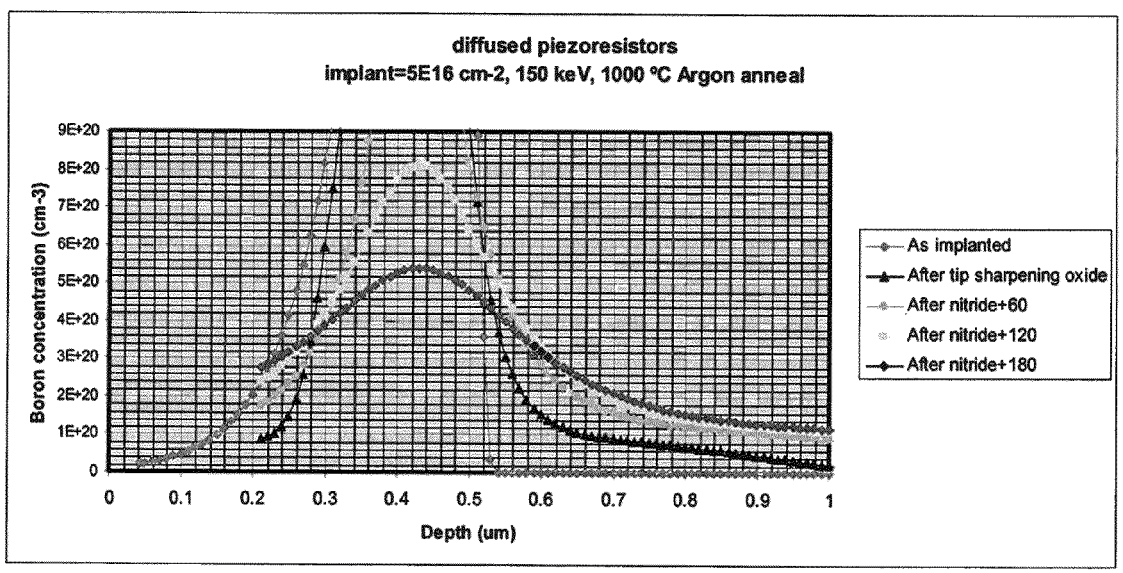
FIG. 1 shows the depth wise concentration profile of boron in the handle wafer in one embodiment.
Figure 2E:
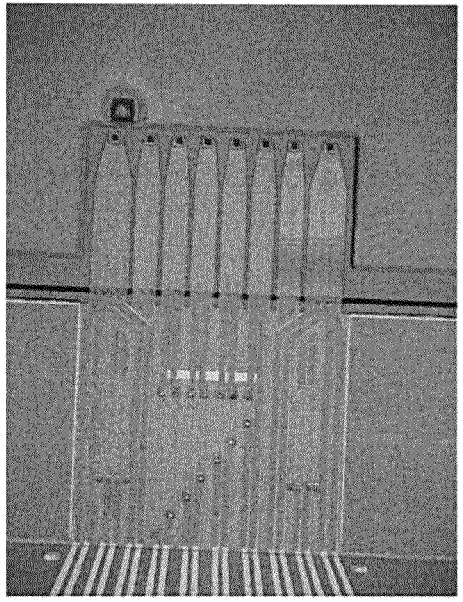
Figure 2F:
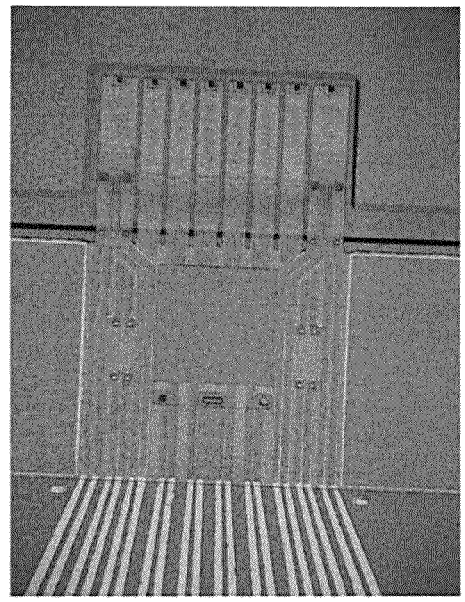
Figure 2G:
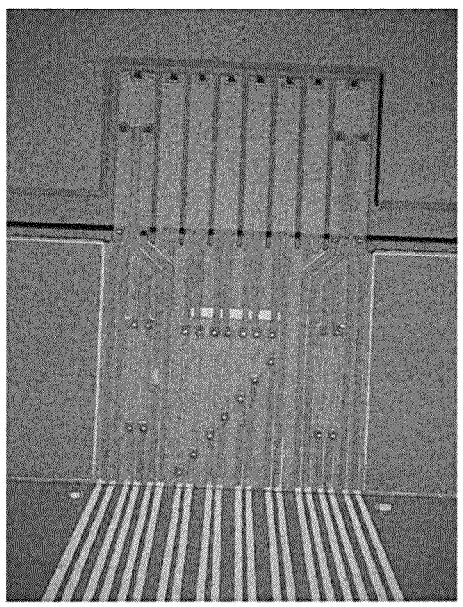
Figure 2H:
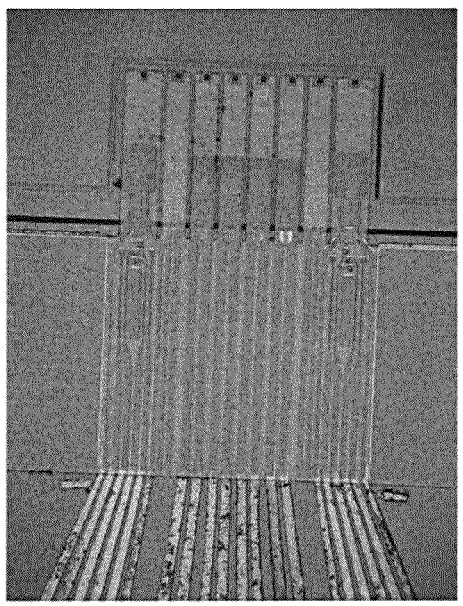
Figure 2I:
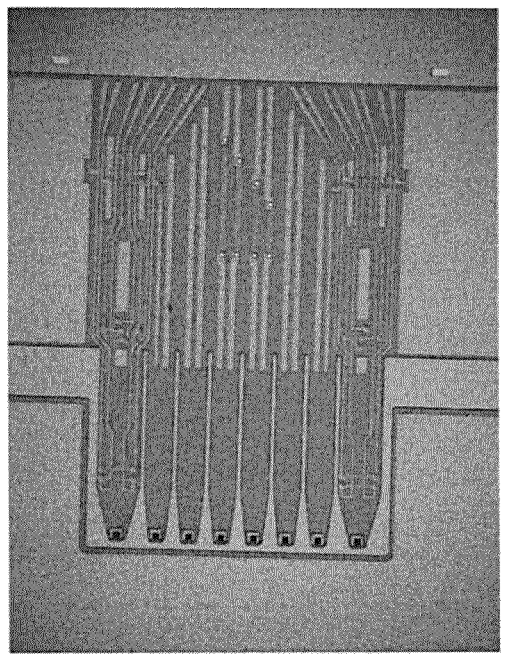
Figure 2J:
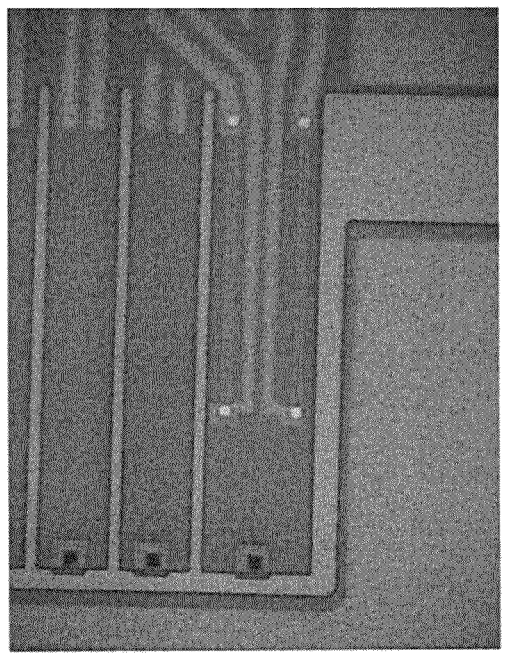

All references cited herein are incorporated by reference in their entirety.

Introduction

For practice of the various embodiments described herein, lithography, microlithography, and nanolithography instruments, pen arrays, active pens, passive pens, inks, patterning compounds, kits, ink delivery, software, and accessories for direct-write printing and patterning can be obtained from NanoInk, Inc., Chicago, Ill. Instrumentation includes the NSCRIPTOR. Software includes INKCAD software (NanoInk, Chicago, Ill.), providing user interface for lithography design and control. E-Chamber can be used for environmental control. Dip Pen Nanolithography™ and DPN™ are trademarks of NanoInk, Inc.

The following patents and co-pending applications related to direct-write printing with use of cantilevers, tips, and patterning compounds are hereby incorporated by reference in their entirety and can be used in the practice of the various embodiments described herein, including inks, patterning compounds, software, ink delivery devices, and the like:

U.S. Pat. No. 6,635,311 to Mirkin et al., which describes fundamental aspects of DPN printing including inks, tips, substrates, and other instrumentation parameters and patterning methods;

U.S. Pat. No. 6,827,979 to Mirkin et al., which further describes fundamental aspects of DPN printing including software control, etching procedures, nanoplotters, and complex and combinatorial array formation.

U.S. patent publication number 2002/0122873 A1 published Sep. 5, 2002 ("Nanolithography Methods and Products Produced Therefor and Produced Thereby"), which describes aperture embodiments and driving force embodiments of DPN printing.

U.S. Pat. No. 7,279,046 to Eby et al. ("Methods and Apparatus for Aligning Patterns on a Substrate"), which describes alignment methods for DPN printing.

U.S. Pat. No. 7,060,977 to Dupeyrat et al. ("Nanolithographic Calibration Methods"), which describes calibration methods for DPN printing.

U.S. Patent Publication 2003/0068446, published Apr. 10, 2003 to Mirkin et al. ("Protein and Peptide Nanoarrays"), which describes nanoarrays of proteins and peptides.

U.S. Pat. No. 7,361,310 to Mirkin et al. ("Direct-Write Nanolithographic Deposition of Nucleic Acids from Nanoscopic Tips"), which describes nucleic acid.

U.S. Pat. No. 7,273,636 to Mirkin et al. ("Patterning of Solid State Features by Direct-Write Nanolithographic Printing"), which describes reactive patterning and sol gel inks (now published Aug. 28, 2003 as 2003/0162004).

U.S. Pat. Nos. 6,642,129 and 6,867,443 to Liu et al. ("Parallel, Individually Addressable Probes for Nanolithography"), describing active pen arrays.

U.S. Patent Publication 2003/0007242, published Jan. 9, 2003 to Schwartz ("Enhanced Scanning Probe Microscope and Nanolithographic Methods Using Same").

U.S. Patent Publication 2003/0005755, published Jan. 9, 2003 to Schwartz ("Enhanced Scanning Probe Microscope").

U.S. Pat. No. 7,093,056 to Demers et al., describing catalyst nanostructures and carbon nanotube applications.

U.S. Pat. No. 7,199,305 to Cruchon-Dupeyrat et al., and U.S. Pat. No. 7,102,656 to Mirkin et al., describing printing of proteins and conducting polymers respectively.

U.S. Pat. No. 7,005,378 to Crocker et al., describing conductive materials as patterning compounds.

U.S. patent application Ser. No. 10/689,547 filed Oct. 21, 2003, now published as 2004/0175631 on Sep. 9, 2004, describing mask applications including photomask repair.

U.S. Pat. No. 7,034,854 Cruchon-Dupeyrat et al., describing microfluidics and ink delivery.

U.S. patent application Ser. No. 10/788,414 filed Mar. 1, 2004, now published as 2005/0009206 on Jan. 13, 2005 describing printing of peptides and proteins.

U.S. Pat. No. 7,326,380 to Mirkin et al., describing ROMP methods and combinatorial arrays.

U.S. Pat. No. 7,491,422 to Zhang et al., describing stamp tip or polymer coated tip applications.

U.S. patent application Ser. No. 11/065,694 filed Feb. 25, 2005, now published as 2005/0235869 on Oct. 27, 2005, describing tipless cantilevers and flat panel display applications.

US Patent publication 2006/001,4001 published Jan. 19, 2006 describing etching of nanostructures made by DPN methods.

WO 2004/105046 to Liu & Mirkin published Dec. 2, 2004 describes scanning probes for contact printing.

U.S. patent application Ser. No. "Active Pen Nanolithography," 11/268,740 to Shile et al. filed Nov. 8, 2005 describes for example thermocompression bonding and silicon handle wafers.

DPN methods are also described in Ginger et al., "The Evolution of Dip-Pen Nanolithography," *Angew. Chem. Int. Ed.* 2004, 43, 30-45, including description of high-throughput parallel methods. See also Salaita et al., "Applications of Dip-Pen Nanolithography," Nature Nanotechnology, 2007, Advanced On-line publication (11 pages).

Direct write methods, including DPN printing and pattern transfer methods, are described in for example *Direct-Write Technologies, Sensors, Electronics, and Integrated Power Sources*, Pique and Chrisey (Eds), 2002.

The direct-write nanolithography instruments and methods described herein are of particular interest for use in preparing bioarrays, nanoarrays, and microarrays based on peptides, proteins, nucleic acids, DNA, RNA, viruses, biomolecules, and the like. See, for example, U.S. Pat. No. 6,787,313 for mass fabrication of chips and libraries; U.S. Pat. No. 5,443,791 for automated molecular biology laboratory with pipette tips; U.S. Pat. No. 5,981,733 for apparatus for the automated synthesis of molecular arrays in pharmaceutical applications. Combinatorial arrays can be prepared. See also, for example, U.S. Pat. Nos. 7,008,769; 6,573,369; and 6,998,228 to Henderson et al.

Scanning probe microscopy is reviewed in Bottomley, *Anal. Chem.*, 1998, 70, 425R-475R. Also, scanning probe microscopes are known in the art including probe exchange mechanisms as described in, for example, U.S. Pat. No. 5,705,814 (Digital Instruments).

Microfabrication methods are described in for example Madou, *Fundamentals of Microfabrication*, $2^{nd}$ Ed., 2002, and also Van Zant, *Microchip Fabrication*, $5^{th}$ Ed., 2004.

See for example U.S. Pat. No. 6,827,979 to Mirkin et al. is also incorporated by reference in its entirety.

US Patent Publication 2003/0022470 and Publication 2006/0228873 to Liu et al. describe cantilever fabrication methods.

US Patent Publication 2006/0040057 to King, Sheehan et al. describes thermal DPN printing methods.

Cantilevers

Some embodiments comprise devices comprising one or more cantilevers. Some cantilevers may be of microscopic dimension. Some cantilevers may be of nanoscopic dimension. Some cantilevers may be used in such devices as atomic microscopes, scanning microscopes, or nanoscopes. Some cantilevers may be used to deposit materials on surfaces, measure local heights of surfaces, perform local heating or cooling of surfaces, and the like.

In some embodiments, cantilevers may comprise silicon nitride. Alternatively, they may comprise silicon carbide. These materials are tough polycrystalline ceramics, having high wear resistances. Both silicon nitride and silicon carbide are electrical insulators. Cantilevers made from these materials do not become electrically charged as silicon cantilevers do. Control over electrostatic fields in these cantilevers is improved over those made from silicon. Because these materials are also chemically inert, cantilevers made from them may also be used with biological materials. Silicon nitride may be more readily commercially available than silicon carbide.

Some cantilevers may be configured into arrays. Such arrays may be one-dimensional. Some arrays may have more than one dimension. In some embodiments, cantilevers are configured into two-dimensional arrays.

Support Structures

Some cantilevers may be supported by a support structure or handle wafer. U.S. regular application Ser. No. 11/690,738 filed Mar. 23, 2007 to Mirkin et al. describes support structures, which is hereby incorporated by reference in its entirety. Some support structures may be non-transparent. They may be fabricated from substantially non-transparent materials or from transparent materials that are rendered substantially non-transparent. For example, the surface of transparent borosilicate glass may be scratched, etched, roughened, or otherwise modified in such a way that it become substantially non-transparent.

Some support structures may be fabricated from single crystal silicon, which has several advantages over borosilicate glass. Hole etching may be easier and less expensive. Difficulties bonding cantilevers to support structures caused by surface irregularities may also be avoided. Single crystal silicon may also provide for easier etching control. Alternatively, some support structures may be fabricated from polycrystalline silicon.

Tips

Some cantilevers may comprise one or more tips. Some tips may comprise the same materials as the rest of their cantilevers. In some embodiments, tips may comprise different materials than the rest of their cantilevers.

In some embodiments, tips may be able to be heated. Heating may be accomplished by inductive heating, resonance heating, resistive heating, and the like. Where cantilevers comprise insulating materials, such as silicon nitride or silicon carbide, tips may be maintained at temperatures substantially higher than those of locations on the cantilever removed from such heated tips.

Some tips may extend below the rest of their cantilevers. Such tips may contact a surface below their cantilevers. Some tips may take up substances from surfaces or deposit substances to surfaces. Some tips may heat surfaces or substances on surfaces. Some tips may be heated by surfaces or substances on surfaces. Such tips are useful for use in such applications as thermal active pens.

Some tips may be scanning tips. Such tips may be used to detect features of surfaces or substances on surfaces below their cantilevers. Such features may include local physical dimensions such as height, local chemical compositions, and the like.

Some tips may be microscope tips, such as atomic microscope tips. Some tips may be nanoscope tips. Other variants will be understood by those skilled in the art.

Piezoresistors

Some cantilevers may comprise one or more piezoresistors. Piezoresistors are resistors made from piezoelectric materials. The resistance of such materials changes when subjected to mechanical stress. Examples of piezoelectric materials include, but are not limited to, germanium, polycrystalline silicon, amorphous silicon, silicon carbide, and single crystal silicon.

Piezoresistors may comprise heavily-doped silicon. The silicon can be single crystal silicon or can be polycrystalline silicon. A preferred dopant is boron. A piezoresistor comprising silicon heavily-doped with boron can be substantially insensitive to changes in temperature. Such a piezoresistor may overcome the temperature compensation difficulties commonly encountered by other designs that use lightly-doped silicon or intrinsic silicon, which are more sensitive to changes in temperature. Such a piezoresistor may also enable investigation of piezocapacitive structures, which have not before been explored.

In some embodiments, such piezoresistors may be placed directly on the cantilever at locations where they can measure peak stress (related to tip deflection) without themselves affecting substantially the mechanical characteristics of the cantilever. This can improve fidelity of the measured stress relative to alternative designs.

In some embodiments, piezoresistors may comprise a Wheatstone bridge consisting of two active piezoresistors and two reference piezoresistors. In preferred embodiments, the reference piezoresistors are placed directly on the cantilever. In such a case, where the reference piezoresistors are placed in close proximity to the active piezoresistors, electrical noise is diminished relative to bridges where the reference piezoresistors are remotely located. (Cf., e.g., such a design in F. Goericke et al., *Sensors and Actuators A*143 (2008), pp. 181-190, where remote piezoresistors were used without reference piezoresistors.)

The number of piezoresistors on a cantilever need not be limited to one. For example, in one embodiment, multiple piezoresistors can be placed on a single cantilever. This design can allow two legs of a full Wheatstone bridge to be fabricated onto a single cantilever.

Sensing Height

Two fundamental activities associated with cantilevers are positioning tips over specific locations on a surface and determining the vertical displacements (heights) of the tips with respect to the surface. Both activities require knowledge of positions of the tips relative to the actuators that direct the cantilevers' movements. Such knowledge is not perfect, but is subject to several uncertainties.

One source of uncertainty is the fact that materials expand and contract in response to changes in temperature. Materials' responses are characterized by their coefficients of thermal expansion, which will differ according to composition. Where different materials are used, for example in cantilevers and their tips, this uncertainty is compounded. Another source of uncertainty is the presence of built-in stresses that might be introduced during fabrication, which might lead to torsional rotation in response to changes in temperature. Still another source of uncertainty is actual physical bending or twisting of materials during fabrication, introducing additional unforeseen positional offsets into the devices.

Because of the small scales involved with cantilevers operating at microscopic or nanoscopic size scales, reducing such uncertainties during design and fabrication important. Also helpful is having the capability to detect changes in tip location in real-time during cantilever operation. In some embodiments, one or more strain gauge sensors comprising piezoresistors may be fabricated on a cantilever, to enable real-time detection of variation in the position of one or more tips. Through use of multiple piezoresistors on a cantilever, the position of maximum stress may be detected, which is related to tip deflection.

An alternative strain gauge design comprises metal layers fabricated on the cantilever. Such metals as chromium, nickel-chromium alloys, copper-nickel alloys, platinum, and platinum-tungsten alloys might be used. In some embodiments, the metal layers may comprise a serpentine structure along the length of the cantilever. In some preferred embodiments, such serpentine structures are fabricated on two opposing sides of a cantilever. Such a configuration could double the sensitivity of the gauge and reduce electrical noise if configured into a half Wheatstone bridge. It also allows electrical cancellation of effects that would affect both structures, such as those introduced by the thermal coefficient of resistance of the strain gauge material or the presence of local heat sources or sinks.

These piezoresistors and metal strain gauges may optionally be used in conjunction with other tip tracking methods, such as laser fluorometry.

Note that when tips are deflected due to contact with surfaces, the force of contact may be estimated from the resistances measured from the piezoresistors or strain gauges, owing to the relationship between stress and strain of the cantilever materials.

Fabricating Cantilever, Tips, Strain Gauges

In preparing the cantilever, one embodiment provides a cantilever comprising a strain gauge structure comprising one or more tips, wherein the cantilever is prepared by: (i) providing an oxidized silicon wafer comprising a silicon dioxide layer on silicon, (ii) patterning the silicon dioxide layer to generate etch openings adapted for formation of at least two tips, (iii) etching the silicon wafer anisotropically, (iv) depositing and patterning silicon nitride to form the cantilever, and (v) optionally bonding the cantilever to a handle wafer.

Fabrication of the pen can be carried out with the same basic process flow developed by Quate's group during the 1990's (1,2) and used by NanoInk to make various DPN pen systems.

In one embodiment, this process starts with a highly accurate e-beam written mask to pattern one or more square openings onto an oxidized silicon surface, which will become one or more tips. The openings can be of any size. For example, they can be between about 1 micron to about 60 microns, such as between about 2 microns to about 50 microns. The size of the one or more openings can be the same or different from one another. Where more than one opening is used, v-trenches can be patterned between multiple holes to form mechanical stiffeners in the nitride.

Subsequently, the wafer can be immersed in a KOH etch solution to etch anisotropically pyramidal pits into the silicon wafer to form the basic tip mold(s) and the optional v-trenches. The masking oxide can then be stripped and the wafers re-oxidized at 950° C. for 360 minutes to grow about 3900 Å of silicon oxide. At this time and temperature, the oxide at the bottom of the pit is hindered with respect to growth, and thus when a cast film is deposited in this pit, the tip sharpness can approach a 10 nm tip radius or smaller. No maximum limit of the tip size need to be imposed. For instance, the tip size can be increased by increasing the pit size.

Silicon nitride with low stress gradient can then be deposited onto the mold wafer to form a cantilever. In one embodiment, the nitride thickness is about 600 nm. Accordingly, with this thickness and a width of 25 um and a length of 200 um, a rectangular cantilever in this embodiment can have a spring constant of about 0.04 N/m. While this is a value that is commonly used for contact mode AFM probes and can work well for DPN, other spring constants may also be obtained and used. Not to be bound by any particular theory, the spring constant changes linearly with width w and with the third power of length L such that for a given thickness t, a wide range of spring constants K can be obtained: $K=Ewt^3/4L^3$, where E will depend on the materials of construction. In one alternative embodiment, the thickness of the nitride may also be changed on a batch basis to have a larger variation in spring constant. For example, nitride thicknesses from 400 nm to 1000 nm for cantilevers (with spring constant ranging from 0.0015 to over 1 N/m) have been used by NanoInk for different applications.

The nitride can be oxidized, patterned, and etched to form the cantilevers and bonding area. In one embodiment, a borosilicate glass wafer can be further anodically bonded to the patterned nitride wafer. The borosilicate glass can be scribed with a dicing saw to form the individual holder chips for each die before the tip mold wafer is etched away leaving the nitride cantilever attached to the borosilicate glass chip ready for use on the NanoInk's NSCRIPTOR™.

After the nitride is patterned, a photoresist layer is patterned for lift-off, and the strain-gauge metal is deposited and then lifted off the nitride wafer. A second resist pattern is added where the nitride layer will be bonded to the handle wafer. Subsequently, chromium, platinum, and gold is deposited and lifted off. A similar Cr/Pt/Au layer can be deposited on patterned handle wafer and then the two wafers are aligned and bonded using heat and temperature in a process such as gold thermocompression bonding. The wafers can then be etched in tetramethylammonium hydroxide to remove the mold wafer and separate the handle wafer into individual dice.

Fabricating Piezoresistors

Piezoresistors may be fabricated by a process comprising (i) forming at least one piezoresistor in a handle wafer; (ii) forming at least one cantilever disposed on the handle wafer; (iii) annealing the handle wafer such that at least a portion of each piezoresistor is attached to the cantilever; and (iv) selectively removing the handle wafer such that at least the cantilever and the piezoresistors remain.

The silicon can be doped with a n-type dopant, such as boron. The concentration of the boron can be for example greater than $0.5 \times 10^{20}$ atoms $cm^{-3}$, such as at least $3 \times 10^{20}$ atoms $cm^{-3}$. The dose of the dopant can vary with the thickness. For instance, in one embodiment, wherein the thickness is about 2 microns, the dose can be about $5 \times 10^{16}$ atoms $cm^{-2}$. The dopant can be introduced into the silicon by ion implantation or diffusion. In one embodiment, wherein ion implantation is employed, the ion implantation can be performed at 150 keV.

In some embodiments, some piezoresistors can serve to provide an etch stop for the subsequent KOH etch used to remove the undesired portions of the silicon handle wafer. In other embodiments, the use of heavily boron-doped silicon can help ensure the resistance of the structure remains substantially constant, even in the presence of a longer etching time, such as a doubling in etching time. The electrical and mechanical properties of such a structure can be highly resilient to process variations.

In one embodiment, after the tip is sharpened, such as by the oxidation process discussed above, a wafer or layer of silicon nitride can be deposited onto the tip and the handle wafer. In one embodiment, after the sharpening of the tip, about 0.1 microns to about 0.4 microns, such as about 0.22 microns of the silicon handle wafer was consumed. The silicon nitride can later become the cantilever. Alternatively, silicon carbide can be deposited. The handle wafer, with the newly formed cantilever and tip, can subsequently be annealed. Any suitable annealing conditions can be applied. In embodiment wherein the cantilever comprises silicon nitride, the structure is annealed in an Argon atmosphere at about 1000° C.

During annealing, the dopant implanted into the handle wafer can migrate. Annealing time will therefore generally affect the depth wise concentration of the dopant in the wafer. Although the dopant may not be in contact with the cantilever prior to annealing, the concentration profile can broaden during annealing to reach the interface between the wafer and the cantilever, finally being in contact with the cantilever. As shown in FIG. 1, the dopant concentration is confined to a certain depth in the as-implanted sample, and it is not until after two or even three hours of annealing that the dopant profile broadens to a desirable depth. In this embodiment, after three hours of annealing at about 1000° C. in Argon, a dopant implanted at $3\times10^{20}$ atoms cm$^{-3}$ extends to depths of about 0.22 µm to about 0.6 µm, averaging about 0.4 µm.

FIGS. 2A-2J illustrate various embodiments of the piezoresistor design. As it can been seen in the figures, the cantilevers can be in the form of an array. They can be used to detect force from various directions. For example, a "twist" sensor is referred to one sensor that can detect torsional force. Similarly, the piezoresistor can be used to detect force in the lateral or axial direction.

REFERENCES (1) T. R. Albrecht, S. Akamine, T. E. Carver, and C. F. Quate, "Microfabrication of cantilever styli for the atomic force microscope," *J. Vac. Sci. Technol. A, Vac. Surf. Films (USA)*, 1990
(2) S. Akamine, and C. F. Quate, "Low temperature oxidation sharpening of microcast tips," *J. Vac. Sci. Technol B.*, vol. 10, No. 5, September/October 1992.

NON-LIMITING WORKING EXAMPLE

Thermal Active Pen with Piezoresistors Fabrication Procedure

A Schematic flowchart of the procedure is provided in FIGS. 3A-3I.
1) Starting material (Nitride and Handle Wafers)
2) Clean (Nitride Wafers)
3) Oxidation (Nitride Wafers)
4) Clean (Nitride Wafers)
5) Tip lithography (Nitride Wafers)
6) Descum
7) Oxide Etch (Nitride Wafers)
8) Strip Resist/Clean (Nitride Wafers)
9) Piezoresistor implant lithography (Nitride Wafers)
10) Piezoresistor implant (Nitride Wafers)
11) Tip Etch (Nitride Wafers)
12) Remove KOH Residue (Nitride Wafers)
13) Strip Oxide (Nitride Wafers)
14) Clean (Nitride Wafers)
15) Oxidize (Nitride Wafers)
16) Sharpen Lithography (Nitride Wafers)
17) Inspect (Nitride Wafers)
18) Oxide Etch (Nitride wafers)
19) Strip Resist/Clean
20) Deposit Silicon Nitride (Nitride Wafers)
21) Piezoresistor Anneal/Drive-in (Nitride Wafers)
22) Cantilever Lithography (Nitride Wafers)
23) Frontside Nitride etch (Nitride Wafers)
24) Backside Lithography (Nitride Wafers)
25) Backside Nitride Etch (Nitride Wafers)
26) Strip Resist/Clean
27) Actuator Lithography (Nitride Wafers)
28) Descum (Nitride Wafers)
29) Deposit Metal (Nitride Wafers)
30) Liftoff Metal (Nitride Wafers)
31) Clean (Handle Wafers)
32) Handle Recess Lithography (Handle Wafers)
33) Silicon Etch (Handle Wafers)
34) Strip Resist and Clean (Handle Wafers)
35) Oxidize (Handle Wafers)
36) Clean (Handle Wafers)
37) TMAH Protect Lithography (Handle Wafers)
38) Oxide Etch (Handle Wafers)
39) Strip Resist and Clean (Handle Wafers)
40) Handle Metal Lithography (Handle Wafers)
41) Descum (Handle Wafers)
42) Deposit Metal (Handle Wafers)
43) Liftoff Metal (Handle Wafers)
44) Clean (Nitride and Handle Wafers)
45) Align and Bond Handle Wafer to Cantilever/Actuator Wafer (Nitride and Handle Wafers)
46) Silicon Etch (Bonded Wafer Assembly)
47) Etch Back Oxide (Bonded Wafer Assembly)
48) Remove Remnants of Corner Compensation Beams

What is claimed is:

1. A device comprising:
    a cantilever comprising a tip, wherein the cantilever and the tip are formed of a continuous unitary layer of silicon nitride or silicon carbide; and
    a piezoresistor attached to the cantilever, the piezoresistor comprising silicon and a dopant comprising boron, and the dopant having a concentration of at least $0.5\times10^{20}$ atoms per cubic centimeter.

2. The device according to claim 1, wherein said piezoresistor comprises single crystal silicon.

3. The device according to claim 1, wherein said piezoresistor comprises polycrystalline silicon.

4. The device according to claim 1, further comprising at least one strain gauge disposed on said cantilever.

5. The device according to claim 1, wherein the cantilever comprises a first surface, a second surface, a first strain gauge, and a second strain gauge, wherein said first surface and said second surface are opposing, said first strain gauge is disposed on said first surface, and said second strain gauge is disposed on said second surface.

6. The device according to claim 1, wherein the cantilever is a part of an array of cantilevers in the device.

7. The device according to claim 6, wherein the array is a one-dimensional array of cantilevers.

8. The device according to claim 6, wherein the array is a two-dimensional array of cantilevers.

9. The device according to claim 1, wherein the tip is a microscope tip.

10. The device according to claim 1, wherein the tip is an atomic microscope tip.

11. The device according to claim 1, the tip is a scanning microscope tip.

12. The device according to claim 1, wherein the tip is a nanoscopic tip.

13. The device according to claim 1, further comprising at least one metal contact, wherein said at least one metal contact comprises one or more of Cr, Pt, and Au.

14. The device according to claim 1, wherein the largest of a length, a width, and a thickness of the cantilever is less than about 1000 µm.

15. A method comprising:
    (i) forming a piezoresistor in a silicon mold wafer by doping a portion of the silicon mold wafer with a dopant comprising boron via ion implantation, such that the dopant has a concentration of at least $0.5\times10^{20}$ atoms per cubic centimeter, and such that the piezoresistor is initially formed beneath a surface of the silicon mold wafer;
    (ii) forming a cantilever comprising a tip made by depositing a continuous unitary layer of silicon nitride or silicon carbide on at least a portion of the silicon mold wafer, such that both the cantilever and the tip are formed of the continuous unitary layer of silicon nitride or silicon carbide;
    (iii) after forming the piezoresistor and the silicon nitride cantilever, annealing the mold wafer such that the dopant migrates to the surface of the silicon mold wafer and the piezoresistor becomes attached to the silicon nitride cantilever; and (iv) separating the cantilever and the attached piezoresistor from a remainder the mold wafer.

16. The method of claim 15, further comprising forming at least one metal contact on said cantilever, wherein said at least one metal contact contacts said at least one piezoresistor.

17. The method of claim 16, wherein said at least one metal contact comprises at least one material chosen from the group consisting of chromium, platinum, and gold.

18. The method of claim 15, wherein the doping is performed using ion implantation or ion diffusion.

19. The method of claim 18, wherein said mold wafer comprises polycrystalline silicon.

20. The method of claim 15, wherein said mold wafer comprises single crystal silicon.

21. The method of claim 20, wherein said piezoresistor comprises single crystal silicon.

22. The method of claim 15, wherein said piezoresistor comprises polycrystalline silicon.

23. The method of claim 15, wherein said cantilever is formed by depositing silicon nitride.

24. The method of claim 15, wherein said cantilever is formed by depositing silicon carbide.

25. The method of claim 15, wherein said annealing said mold wafer is performed in an Argon atmosphere at about 1000° C.

26. The method of claim 15, wherein said annealing said mold wafer is performed for about 3 hours.

27. The method of claim 15, wherein the at least one piezoresistor, after said annealing of said mold wafer, has a thickness of between about 0.1 µm to about 0.8 µm.

28. The method of claim 15, wherein the at least one piezoresistor, after said annealing of said mold wafer, has a thickness of about 0.4 µm.

29. The method of claim 15, further comprising forming at least one oxide layer on said mold wafer.

30. A method comprising:
providing a device comprising:
a cantilever comprising a tip, wherein the cantilever and the tip are formed of a continuous unitary layer of silicon nitride or silicon carbide; and
a piezoresistor attached to the cantilever, the piezoresistor comprising silicon and a dopant comprising boron, and the dopant having a concentration of at least $0.5 \times 10^{20}$ atoms per cubic centimeter; and
determining a deflection of the tip using the piezoresistor.

31. The method of claim 30, further comprising transferring material from the tip to a surface.

* * * * *